United States Patent
Ghodsi

(10) Patent No.: US 10,490,279 B2
(45) Date of Patent: *Nov. 26, 2019

(54) ERASABLE BLOCK SEGMENTATION FOR MEMORY

(71) Applicant: Micron Technology, Inc., Boise, ID (US)

(72) Inventor: Ramin Ghodsi, San Jose, CA (US)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/123,772

(22) Filed: Sep. 6, 2018

(65) Prior Publication Data

US 2019/0074061 A1 Mar. 7, 2019

Related U.S. Application Data

(63) Continuation of application No. 15/489,276, filed on Apr. 17, 2017, now Pat. No. 10,096,365, which is a continuation of application No. 15/082,664, filed on Mar. 28, 2016, now Pat. No. 9,627,067, which is a continuation of application No. 13/600,591, filed on Aug. 31, 2012, now Pat. No. 9,299,439.

(51) Int. Cl.
| | |
|---|---|
| *G11C 16/04* | (2006.01) |
| *G11C 16/14* | (2006.01) |
| *G11C 16/34* | (2006.01) |
| *G06F 3/06* | (2006.01) |
| *G11C 16/08* | (2006.01) |
| *G11C 16/16* | (2006.01) |
| *G11C 16/26* | (2006.01) |

(52) U.S. Cl.
CPC .......... *G11C 16/0483* (2013.01); *G06F 3/064* (2013.01); *G11C 16/08* (2013.01); *G11C 16/14* (2013.01); *G11C 16/16* (2013.01); *G11C 16/26* (2013.01); *G11C 16/3418* (2013.01); *G06F 2212/00* (2013.01)

(58) Field of Classification Search
CPC .. G11C 16/0483; G11C 16/14; G11C 16/3418
See application file for complete search history.

(56) References Cited

U.S. PATENT DOCUMENTS

| | | |
|---|---|---|
| 6,262,914 B1 | 7/2001 | Smayling et al. |
| 6,872,640 B1 | 3/2005 | Mouli |
| 7,042,765 B2 | 5/2006 | Sibigtroth et al. |
| 7,233,024 B2 | 6/2007 | Scheuerlein et al. |
| 7,508,714 B2 | 3/2009 | Fasoli et al. |
| 9,299,439 B2 | 3/2016 | Ghodsi |
| 9,627,067 B2 | 4/2017 | Ghodsi |
| 2012/0069663 A1 | 3/2012 | Itagaki et al. |
| 2012/0176836 A1 | 7/2012 | Iguchi et al. |
| 2014/0063947 A1 | 3/2014 | Ghodsi |
| 2016/0211022 A1 | 7/2016 | Ghodsi |
| 2017/0221565 A1 | 8/2017 | Ghodsi |

*Primary Examiner* — Mohammed A Bashar
(74) *Attorney, Agent, or Firm* — Schwegman Lundberg & Woessner, P.A.

(57) ABSTRACT

Various embodiments comprise apparatuses such as those having a block of memory divided into sub-blocks that share a common data line. Each of the sub-blocks of the block of memory corresponds to a respective one of a number of segmented sources. Each of the segmented sources is electrically isolated from the other segmented sources of the block of memory. Additional apparatuses and methods of operation are described.

23 Claims, 5 Drawing Sheets

ERASABLE BLOCK SEGMENTATION FOR MEMORY

PRIORITY APPLICATION

This application is a continuation of U.S. application Ser. No. 15/489,276, now issued as U.S. Pat. No. 10,096,365, which is a continuation of U.S. application Ser. No. 15/082,664, filed Mar. 28, 2016, now issued as U.S. Pat. No. 9,627,067, which is a continuation of U.S. application Ser. No. 13/600,591, filed Aug. 31, 2012, now issued as U.S. Pat. No. 9,299,439, all of which are incorporated herein by reference in their entirety.

BACKGROUND

Computers and other electronic systems, for example, digital televisions, digital cameras, and cellular phones, often have one or more memory devices to store information. Increasingly, memory devices are being reduced in size to achieve a higher density of storage capacity. Even when increased density is achieved, consumers often demand that memory devices also use less power while maintaining high speed access.

DETAILED DESCRIPTION

Figure 1:
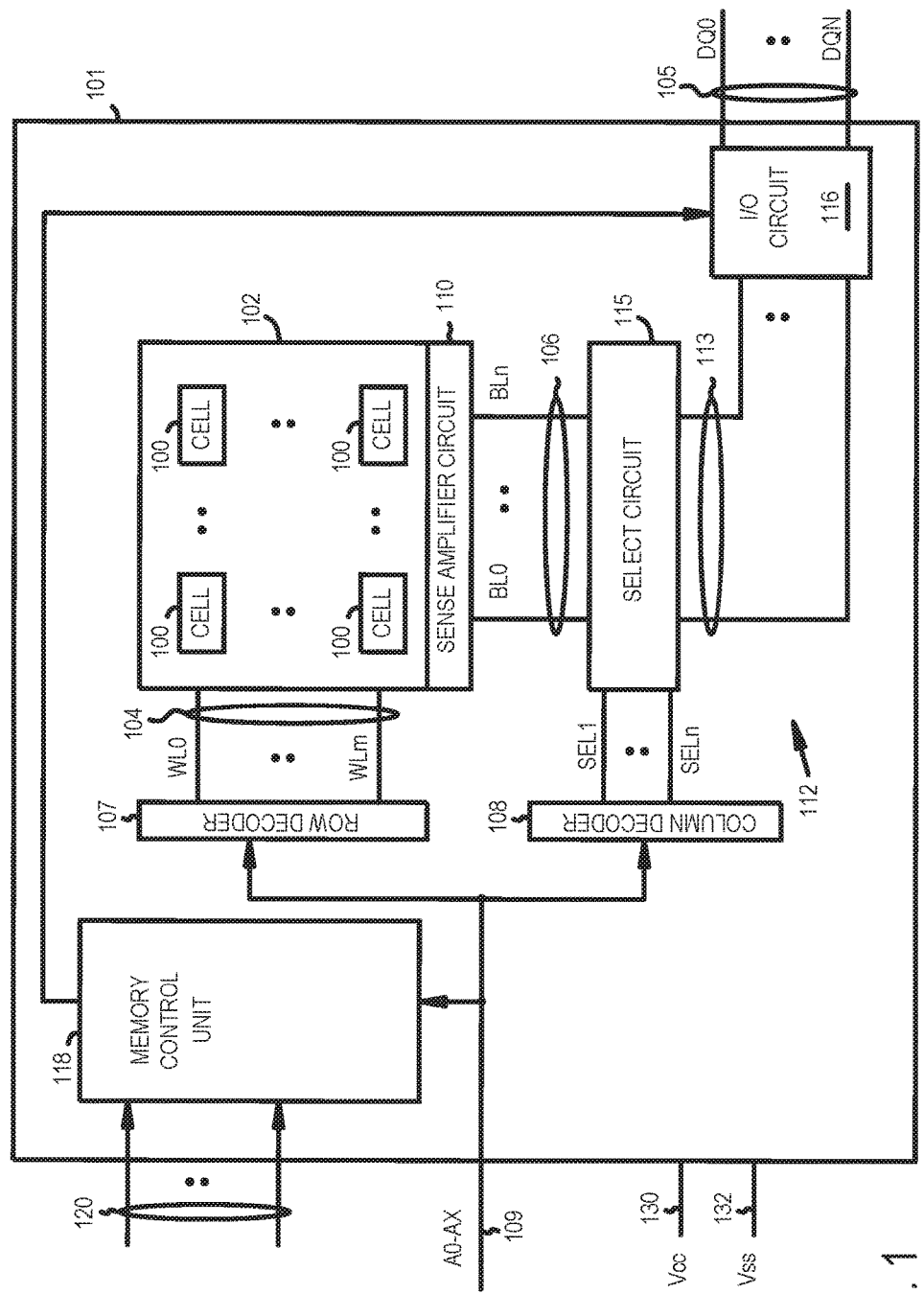
FIG. 1 is a block diagram of a memory device having a memory array with memory cells, according to an embodiment.

The description that follows includes illustrative apparatuses (circuitry, devices, structures, systems, and the like) and methods (e.g., processes, sequences, techniques, and technologies) that embody the subject matter. In the following description, for purposes of explanation, numerous specific details are set forth in order to provide an understanding of various embodiments of the subject matter. After reading this disclosure, it will be evident to those of ordinary skill in the art however, that various embodiments of the subject matter may be practiced without these specific details. Further, well-known apparatuses and methods have not been shown in detail so as not to obscure the description of various embodiments.

To increase the density of a memory device, memory designers consider the area (e.g., footprint) on an underlying substrate for a memory cell. A memory cell may be defined by a feature size, F, where F is the minimum feature size due to various processing limitations, such as lithography limitations, including the numerical aperture and wavelength of the photolithographic systems employed. The memory cell area may have dimensions of 2F by 2F, or $4F^2$. In some two-dimensional NAND memory structures, only one memory cell resides in a $4F^2$ area. In a three-dimensional (3D) NAND memory structure, there may be N tiers (e.g., layers) of memory cells where the memory cells are stacked, one above another, to form the N tiers. Therefore, in these structures, each memory cell may still be defined by the $4F^2$ area. However, there are N memory cells within that area due to the 3D structure.

To further illustrate, a NAND string of memory cells is formed between a source (e.g., a source line, source slot, or source diffusion region) and a data line as is known independently in the art. A block of memory is comprised of a number of pages. The block is the smallest chunk of memory that a user can erase at one time. Contemporaneous devices may have, for example, 32 kilobytes erasable by a common source and a single data line. In a two-dimensional (e.g., planar) memory array, a single block may have two to four megabytes of memory. A 3D memory array may occupy the same area on the substrate but have a much higher density. For example, the block size can be between eight and 16 megabytes, or higher, for the same sized area on the substrate of a two-dimensional memory array. Thus, the 3D memory density can be four times the memory of the two-dimensional array. Consequently, the block size in a 3D memory array is usually larger than the 2D memory array.

One detrimental side effect of this increase in memory density for the same area on the substrate is that the number of simultaneously erasable pages of memory in a block is also increased. For example, if the number of tiers in the 3D NAND memory array is doubled, the number of pages per block can quadruple. In many applications, the increase in block size is inconvenient or even intolerable. Thus, the various embodiments described herein reduce the erasable block size.

In various embodiments described herein, smaller erasable blocks can be achieved by segmenting the global sources and drain select lines within each physical block. Segmentation of the global source allows an erase operation to be limited to one or more selected sub-blocks. The segmented drain select lines are formed to correspond with segmented source lines within each sub-block.

Further, junctions at either end of the NAND string connected to select gate, source-side (SGS) or select gate drain-side (SGD) devices can be designed to have different breakdown voltage depending on which junction is used to initiate the needed erase voltage in the NAND string. For example, if the SGS device is used to initiate the erase voltage then one can design its breakdown voltage to be lower than the SGD device junction. The higher SGD breakdown voltage should help prevent an erase disturb of memory cells in adjacent non-selected sub-blocks by preventing the developed erase voltage to be transmitted to adjacent sub blocks. Examples of erase bias conditions are also described herein to implement the erase operation within individual sub-blocks.

Referring now to FIG. 1, a block diagram of an apparatus in the form of a memory device 101 is shown. The memory device 101 includes one or more memory arrays 102 having a number (e.g., one or more) of memory cells 100 according to an embodiment. The memory cells 100 can be arranged in rows and columns along with access lines 104 (e.g., wordlines to conduct signals WL0 through WLm) and first data lines 106 (e.g., bit lines to conduct signals BL0 through BLn). The memory device 101 can use the access lines 104 and the first data lines 106 to transfer information to and from the memory cells 100. A row decoder 107 and a column decoder 108 decode address signals A0 through AX on address lines 109 to determine which ones of the memory cells 100 are to be accessed.

Sense circuitry, such as a sense amplifier circuit 110, operates to determine the values of information read from the memory cells 100 in the form of signals on the first data lines 106. The sense amplifier circuit 110 can also use the signals on the first data lines 106 to determine the values of information to be written to the memory cells 100.

The memory device 101 is further shown to include circuitry 112 to transfer values of information between the memory array 102 and input/output (I/O) lines 105. Signals DQ0 through DQN on the I/O lines 105 can represent values of information read from or to be written into the memory cells 100. The I/O lines 105 can include nodes of the memory device 101 (e.g., pins, solder balls, or other interconnect technologies such as controlled collapse chip connection (C4), or flip chip attach (FCA)) on a package where the memory device 101 resides. Other devices external to the memory device 101 (e.g., a memory controller or a processor, not shown in FIG. 1) can communicate with the memory device 101 through the I/O lines 105, the address lines 109, or the control lines 120.

The memory device 101 can perform memory operations, such as a read operation, to read values of information from selected ones of the memory cells 100 and a programming operation (also referred to as a write operation) to program (e.g., to write) information into selected ones of the memory cells 100. The memory device 101 can also perform a memory erase operation to clear information from some or all of the memory cells 100.

A memory control unit 118 controls memory operations using signals on the control lines 120. Examples of the signals on the control lines 120 can include one or more clock signals and other signals to indicate which operation (e.g., a programming operation or read operation) the memory device 101 can or should perform. Other devices external to the memory device 101 (e.g., a processor or a memory controller) can control the values of the control signals on the control lines 120. Specific combinations of values of the signals on the control lines 120 can produce a command (e.g., a programming, read, or erase command) that can cause the memory device 101 to perform a corresponding memory operation (e.g., a program, read, or erase operation).

Although various embodiments discussed herein use examples relating to a single-bit memory storage concept for ease in understanding, the inventive subject matter can be applied to numerous multiple-bit schemes as well. For example, each of the memory cells 100 can be programmed to a different one of at least two data states to represent, for example, a value of a fractional bit, the value of a single bit or the value of multiple bits such as two, three, four, or a higher number of bits.

For example, each of the memory cells 100 can be programmed to one of two data states to represent a binary value of "0" or "1" in a single bit. Such a cell is sometimes called a single-level cell (SLC).

In another example, each of the memory cells 100 can be programmed to one of more than two data states to represent a value of, for example, multiple bits, such as one of four possible values "00," "01," "10," and "11" for two bits, one of eight possible values "000," "001," "010," "011," "100," "101," "110," and "111" for three bits, or one of another set of values for larger numbers of multiple bits. A cell that can be programmed to one of more than two data states is sometimes referred to as a multi-level cell (MLC). Various operations on these types of cells are discussed in more detail, below.

The memory device 101 can receive a supply voltage, including supply voltage signals $V_{cc}$ and $V_{ss}$, on a first supply line 130 and a second supply line 132, respectively. Supply voltage signal $V_{ss}$ can, for example, be at a ground potential (e.g., having a value of approximately zero volts). Supply voltage signal $V_{cc}$ can include an external voltage supplied to the memory device 101 from an external power source such as a battery or alternating-current to direct-current (AC-DC) converter circuitry (not shown in FIG. 1).

The circuitry 112 of the memory device 101 is further shown to include a select circuit 115 and an input/output (I/O) circuit 116. The select circuit 115 can respond to signals SEL1 through SELn to select signals on the first data lines 106 and the second data lines 113 that can represent the values of information to be read from or to be programmed into the memory cells 100. The column decoder 108 can selectively activate the SEL1 through SELn signals based on the A0 through AX address signals present on the address lines 109. The select circuit 115 can select the signals on the first data lines 106 and the second data lines 113 to provide communication between the memory array 102 and the I/O circuit 116 during read and programming operations.

The memory device 101 may comprise a non-volatile memory device, and the memory cells 100 can include non-volatile memory cells, such that the memory cells 100 can retain information stored therein when power (e.g., $V_{cc}$, or $V_{ss}$, or both) is disconnected from the memory device 101.

Each of the memory cells 100 can include a memory element having material, at least a portion of which can be programmed to a desired data state (e.g., by being programmed to a corresponding charge storage state). Different data states can thus represent different values of information programmed into each of the memory cells 100.

The memory device 101 can perform a programming operation when it receives (e.g., from an external processor or a memory controller) a programming command and a value of information to be programmed into one or more selected ones of the memory cells 100. Based on the value of the information, the memory device 101 can program the selected memory cells to appropriate data states to represent the values of the information to be stored therein.

One of ordinary skill in the art may recognize that the memory device 101 may include other components, at least some of which are discussed herein. However, several of these components are not shown in the figure, so as not to obscure details of the various embodiments described. The memory device 101 may include devices and memory cells, and operate using memory operations (e.g., programming and erase operations) similar to or identical to those described below with reference to various other figures and embodiments discussed herein.

Figure 2:
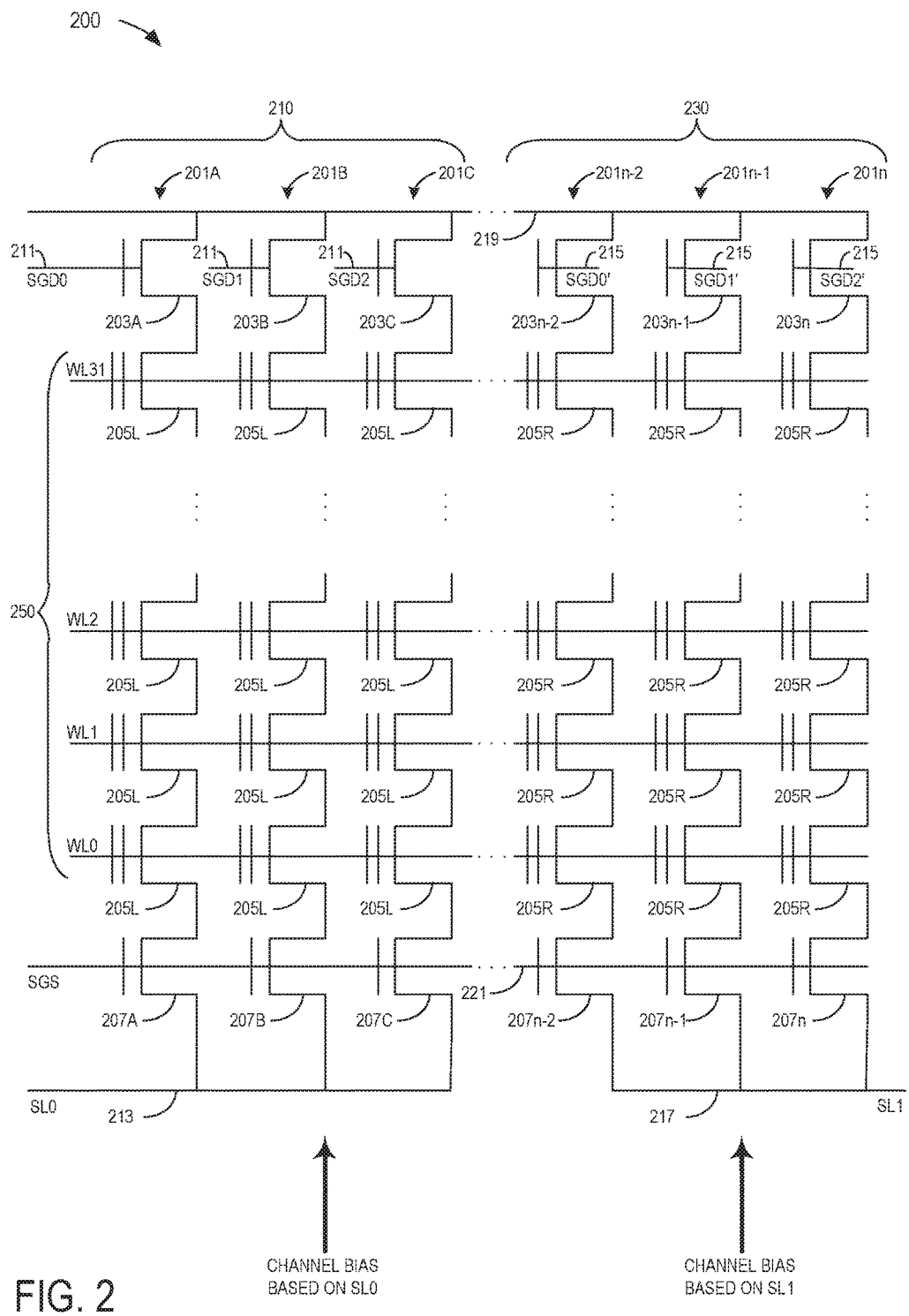
FIG. 2 is a simplified schematic diagram of a portion of a memory block having segmented sources, according to various embodiments.
Figure 3:
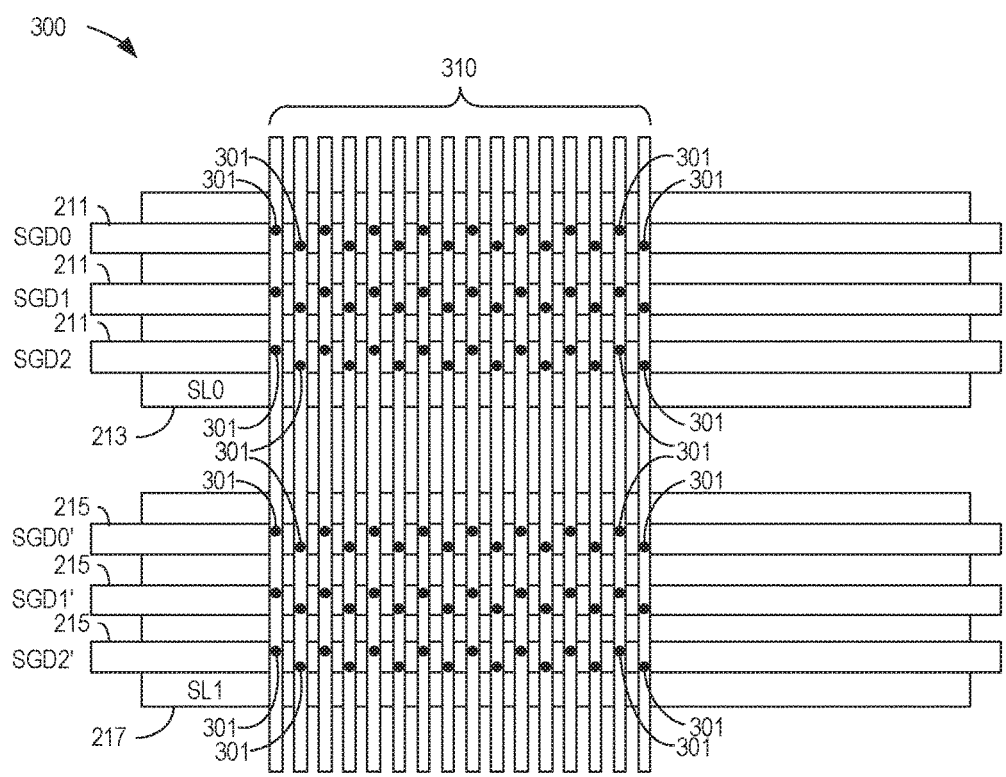
FIG. 3 is a plan view of the portion of the memory block of FIG. 2, showing an example of erasable sub-blocks of the memory.

With concurrent reference now to FIG. 2 and FIG. 3, a simplified schematic diagram of a portion of a memory block 200 having sub-blocks, according to various embodiments, is shown. FIG. 3 shows a plan view 300 of the schematic diagram of FIG. 2.

For ease in understanding the subject matter, only one portion of a three-dimensional memory structure is shown. As will be apparent to a person of ordinary skill in the art, the portion of the memory block 200 may be one portion of a block formed substantially normal to a face of an underlying substrate on which the memory is formed. For example, NAND memory cell strings are arranged substantially perpendicular relative to a face of the substrate. Conventional 3D memory structures are known independently in the art.

The portion of the memory block 200 includes a left-side sub-block 210 and a right-side sub-block 230. However, the disclosed subject matter is not limited to left and right sub-blocks. Sub-blocks may be arranged in various configurations and include varying numbers of strings of memory cells. The number of sub-blocks may be in the hundreds or more, depending on the size of the memory block and the number of strings per sub-block. Additionally, the various embodiments described herein may be used with various types of electronic devices.

Each of the left-side sub-block 210 and the right-side sub-block 230 include a number of NAND memory cell strings 201A, 201B, . . . , 201n. A common bit line 219 is coupled to each of the strings. Although the illustrated portion of the memory block 200 shows only one bit line and six memory cell strings for ease of illustration and discussion, a block typically includes many more bit lines and memory cell strings. The NAND memory cell strings 201A, 201B, 201C in the left-side sub-block 210 each include a number of memory cells 205L. Similarly, each of the NAND memory cell strings 201n-2, 201n-1, 201n in the right-side sub-block 230 includes a number of memory cells 205R. Each of the sub-blocks therefore comprises a number of non-overlapping ones of the memory cell strings 201. For example, the non-overlapping strings indicate that each memory cell/string is only contained within one sub-block. Therefore, no sub-blocks share a memory cell/string.

Each end of the NAND memory cell strings 201A, 201B, 201C in the left-side sub-block 210 is coupled to one of a left-side drain select device 203A, 203B, 203C and a left-side source select device 207A, 207B, 207C. Each end of the NAND memory cell strings 201n-2, 201n-1, 201n in the right-side sub-block 230 is coupled to one of a right-side drain select device 203n-2, 203n-1, 203n and a right-side source select device 207n-2, 207n-1, 207n. Each gate on the source select devices 207A . . . 207n is coupled to a common source select (SGS) line 221.

The left-side sub-block 210 and the right-side sub-block 230 each include a separate set of drain select devices. The left-side sub-block 210 has left-side drain select devices 203A, 203B, 203C. The right-side sub-block 230 has right-side drain select devices 203n-2, 203n-1, 203n. Gates of the left-side drain select devices 203A, 203B, 203C are each coupled separately to left-side select gate on drain side (SGD) lines 211 that can receive signals SGD0, SGD1, SGD2, respectively, while gates of the right-side drain select devices 203n-2, 203n-1, 203n are each coupled separately to right-side SGD lines 215, that can receive signals SGD0', SGD1', SGD2', respectively. Separate bias level may be applied to each of the left-side SGD lines 211 and the right-side SGD lines 215.

Further, each of the left-side sub-block 210 and the right-side sub-block 230 has a separate segmented source; a left-side source 213 and a right-side source 217. The left-side source 213 and a right-side source 217 can therefore be biased with separate bias signals, SL0 and SL1, respectively. Consequently, a separate bias level may be applied to each of the left-side source 213 and a right-side source 217. Examples of various bias signals as they might exist within the memory block 200 are described below with reference to FIG. 4.

Thus, the SGD lines and the source are segmented within the block, with each of the segmented sources 213, 217 of the block corresponding to a respective one of a number of sub-blocks. For example, each portion of the memory block 200 comprising a sub-block has physically segmented sources and drain select lines. Since the sources and drain select lines are physically segmented, the segmented source in one sub-block is electrically isolated from the segmented sources in other sub-blocks. In various embodiments, bit lines, word lines, and source select lines are shared in common between sub-blocks. In other embodiments, the bit lines, word lines, and source select lines may be segmented between sub-blocks.

The portion of the memory block 200 also shows a number of word lines 250. Although the figure indicates there are a total of 32 word lines, the exact number of word lines is irrelevant to the disclosed subject matter. Any higher number or lower number of word lines may be used with the various embodiments described herein. As is evident to a person of ordinary skill in the art, lines labeled WL and the bit line 219 in FIG. 2 may correspond to any one of the access lines 104 and any one of the first data lines 106 of FIG. 1, respectively.

Referring now to FIG. 3, the plan view 300 of the memory block 200 of FIG. 2 indicates a number of data lines 310 (e.g., bit lines) coupled at points 301 to pillars within each NAND memory cell strings 201A, 201B, . . . . 201n. The points 301 may also be considered a connection point from the NAND memory cell strings to selected ones of the data lines 310. Although the figure indicates 16 data lines (e.g., bit lines), the exact number of word lines is irrelevant to the disclosed subject matter. Any higher or lower numbers of data lines may be used with the various embodiments described herein.

The arrangements shown, by way of example, in FIG. 2 and FIG. 3, allow creating erasable sub-blocks without the need to segment the data lines 310 and create independent banks of data lines and associated circuitry (e.g., independent sense circuitry). The creation of independent banks of data lines and associated circuitry would otherwise result in a significant increase in cost and a commensurate increase in area (e.g., footprint) of the memory device. As discussed herein, a lower SGD junction breakdown relative to the SGS junction breakdown can prevent an erase voltage initiated by one source to propagate to the other sub-block via the data lines.

Figure 4:
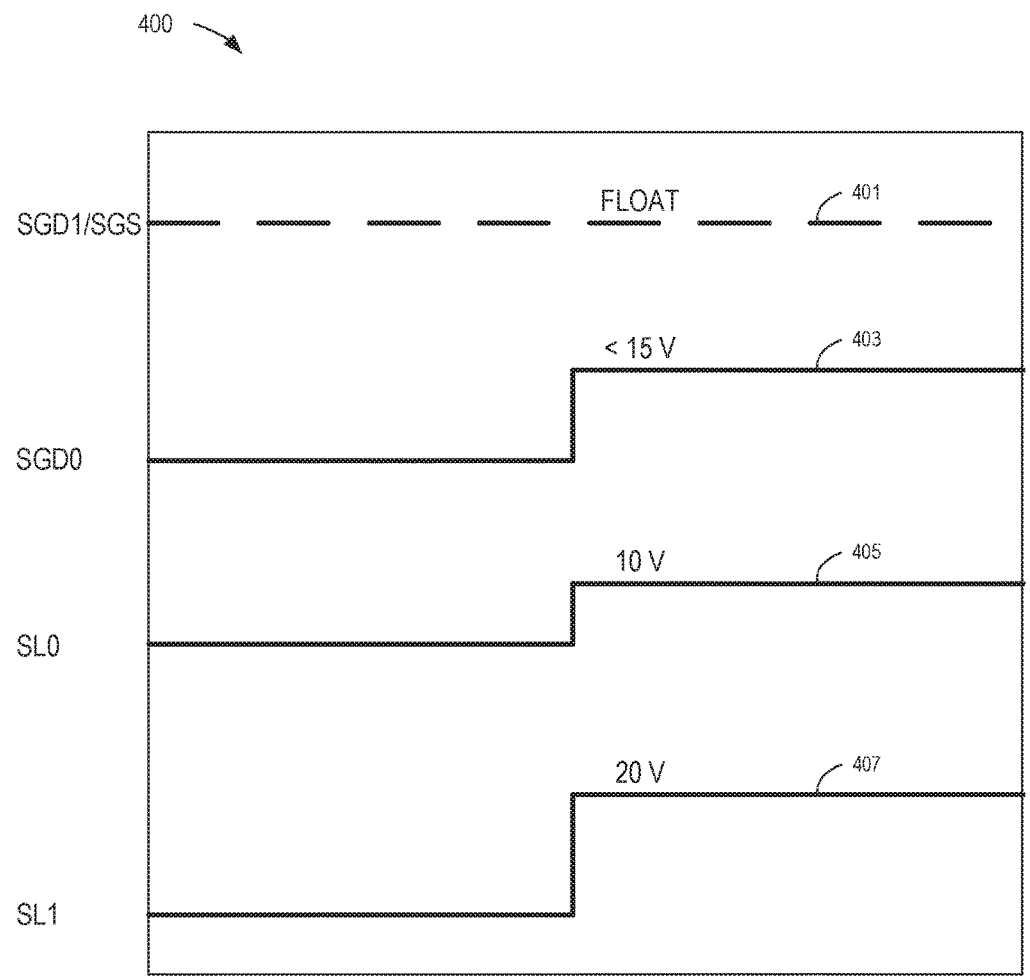
FIG. 4 is a graph of bias conditions that may exist within the memory block of FIG. 3.

FIG. 4 is a graph 400 of bias conditions that may exist within the memory block of FIG. 2. In FIG. 4, an example of signals that can be applied to erase the memory cells 205R in the right-side sub-block 230 while attempting to prevent an erase or erase disturb to the memory cells 205L in the left-side sub-block 210 is shown. When the mechanisms described herein are not used, an erase signal applied within one of the sub-blocks selected for an erase operation may cause an erase disturb, or possibly a complete erasing, of the memory cells in the other non-selected sub-block.

As described previously, the portion of the memory block 200 has physically segmented sources 213, 217 and drain select lines for the sub-blocks 210, 230. The SL1 signal on the right-side source 217 causes current to flow through the channel of each of the memory cells 205R in the NAND memory cell strings 201 in the right-side sub-block 230, raising the channel potential of strings attached to SL1 in FIG. 2. However, a reverse junction bias condition in the left-side drain select devices 203A, 203B, 203C may allow current to flow from the bit line 219 to the memory cells 205L in the left-side sub-block 210. Consequently, the memory cells 205L in the non-selected left-side sub-block 210 should be protected to prevent an unintentional erase or erase disturb.

With reference again to FIG. 4, the graph 400 indicates that the SGD lines coupled to the SGD devices 203 of the selected right-side sub-block 230, and SGS line 221, are allowed to float. A bias level 407 (SL1) applied to segmented source 217 of the selected right-side sub-block 230, is raised to 20 V while a bias level 405 (SL0) of 10 V is applied to segmented source 213. The bias level 407 at 20 V is sufficient to allow erasure of the memory cells 205L in the right-side sub-block 230. However, the bias level 407 (SL0) at 10 V prevents (or at least substantially reduces) the unintentional erasure of the memory cells 205R. The bias level 407 (SL0) at 10 V may prevent the SGD junctions connected to the common data lines from reaching sufficient breakdown voltage levels to cause a leak back from the data line to channels of the memory cells 205L. This can be achieved by initially setting the channel potential in devices on the left side to some intermediate levels (e.g., a level not high enough to cause an erase disturb). Initializing SL0 to a voltage around 10 V (e.g., between about 0 V to about 10 V, in general) initializes the channel in the left side to a higher intermediate potential thereby reducing the SGD junction potential on the data line side when SL1 is raised to 20V.

Keeping the bias level 403 on the drain select lines 211 coupled to the SGD device 203A, for example, at an SGD0 value no more than 15 V (or approximately 75% of the bias level 407 applied to segmented source 217), prevents gate oxide breakdown to occur in left side SGD devices and help the reverse bias condition discussed above not to occur. This prevents the voltage on the bit line 219 causing an erase disturb in the memory cells 205L. Ensuring that the SGD junction breakdown voltage is less than the SGS junction breakdown, only approximately 10 V (in this example) is another important design feature preventing BL voltage transfer to 205L devices preventing erase disturb. As described above, 10 V is insufficient to effect an erase disturb condition. Consequently, a selection of applied bias voltage, a segmented source, and/or design of the breakdown voltage for the SGD devices allow sub-blocks within a memory device to be selectively erased while preventing (or at least substantially reducing) an erase disturb of memory cells in non-selected sub-blocks. In this way, selected sub-blocks can be erased at will.

Optimization of breakdown voltages within a device is known independently in the art and may include dopant selection and dopant profiling within the device. Additionally, junctions within the various devices may be formed so that the breakdown voltages on the various devices may be asymmetric (e.g., the SGD junction on the data line side versus the SGS junction on the source side).

Based on reading and understanding the disclosure provided herein, a person of ordinary skill in the art may readily extend the techniques and concepts to any number and various arrangements of memory cells. For example, the person of ordinary skill in the art can apply the techniques and concepts to a memory block with hundreds, thousands, or even more sub-blocks. Thus, many embodiments may be realized.

Figure 5:
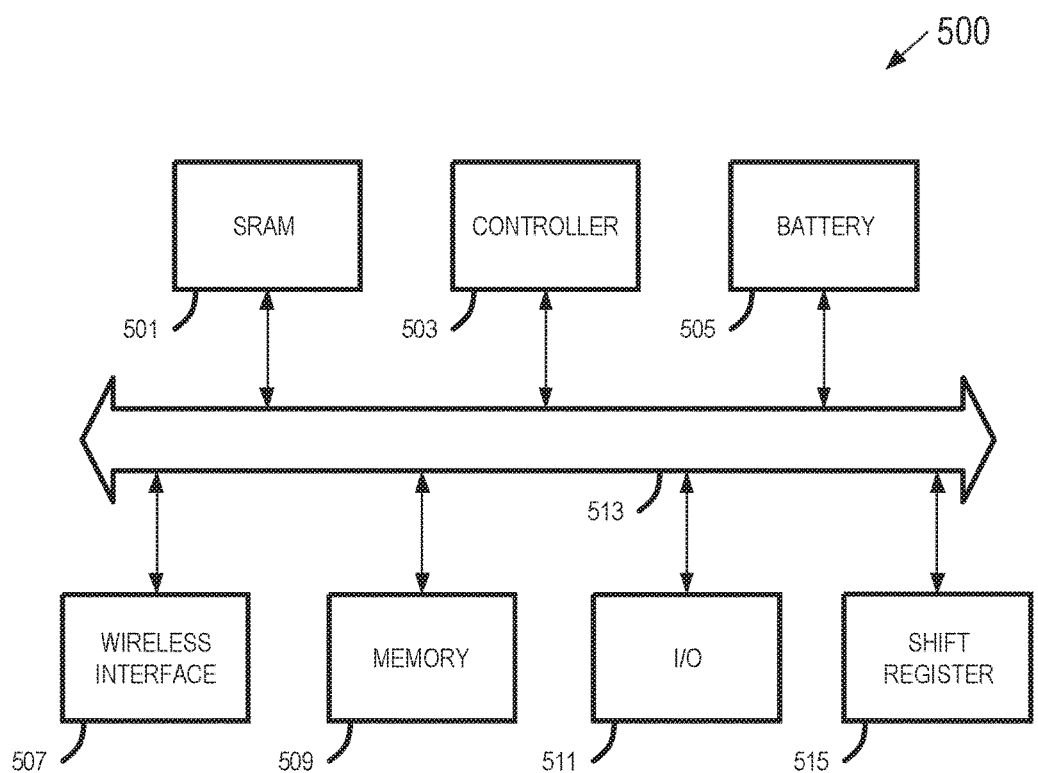
FIG. 5 is a block diagram of a system embodiment, including a memory device.

For example, a system 500 of FIG. 5 is shown to include a controller 503, an input/output (I/O) device 511 (e.g., a keypad, a touchscreen, or a display), a memory device 509, a wireless interface 507, a static random access memory (SRAM) device 501, and a shift register 515, coupled to each other via a bus 513. A battery 505 may supply power to the system 500 in one embodiment. The memory device 509 may include a NAND memory, a flash memory, a NOR memory, a combination of these, or the like.

The controller 503 may include, for example, one or more microprocessors, digital signal processors, micro-controllers, or the like. The memory device 509 may be used to store information transmitted to or by the system 500. The memory device 509 may optionally also be used to store information in the form of instructions that are executed by the controller 503 during operation of the system 500 and may be used to store information in the form of user data either generated, collected, or received by the system 500 (such as image data). The instructions may be stored as digital information and the user data, as disclosed herein, may be stored in one section of the memory as digital information and in another section as analog information. As another example, a given section at one time may be labeled to store digital information and then later may be reallocated and reconfigured to store analog information. The controller 503, the memory device 509, and and/or the shift register 515 may include one or more of the novel memory devices described herein.

The I/O device 511 may be used to generate information. The system 500 may use the wireless interface 507 to transmit and receive information to and from a wireless communication network with a radio frequency (RF) signal. Examples of the wireless interface 507 may include an antenna, or a wireless transceiver, such as a dipole antenna. However, the scope of the inventive subject matter is not limited in this respect. Also, the I/O device 511 may deliver a signal reflecting what is stored as either a digital output (if digital information was stored), or as an analog output (if analog information was stored). While an example in a wireless application is provided above, embodiments of the inventive subject matter disclosed herein may also be used in non-wireless applications as well. The I/O device 511 may include one or more of the novel memory devices described herein.

The various illustrations of the methods and apparatuses are intended to provide a general understanding of the structure of various embodiments and are not intended to provide a complete description of all the elements and features of the apparatuses and methods that might make use of the structures, features, and techniques described herein.

The apparatuses of the various embodiments may include or be included in, for example, electronic circuitry used in high-speed computers, communication and signal processing circuitry, single or multi-processor modules, single or multiple embedded processors, multi-core processors, data switches, and application-specific modules including multi-layer, multi-chip modules, or the like. Such apparatuses may further be included as sub-components within a variety of electronic systems, such as televisions, cellular telephones, personal computers (e.g., laptop computers, desktop computers, handheld computers, tablet computers, etc.), workstations, radios, video players, audio players, vehicles, medical devices (e.g., heart monitors, blood pressure monitors, etc.), set top boxes, and various other electronic systems.

A person of ordinary skill in the art will appreciate that, for this and other methods (e.g., erase operations) disclosed herein, the activities forming part of various methods may be implemented in a differing order, as well as repeated, executed simultaneously, with various elements or bias levels substituted one for another. Further, the outlined acts and operations are only provided as examples, and some of the acts and operations may be optional, combined into fewer acts and operations, or expanded into additional acts and operations without detracting from the essence of the disclosed embodiments.

The present disclosure is therefore not to be limited in terms of the particular embodiments described in this application, which are intended as illustrations of various aspects. Many modifications and variations can be made, as will be apparent to a person of ordinary skill in the art upon reading and understanding the disclosure. Functionally equivalent methods and apparatuses within the scope of the disclosure, in addition to those enumerated herein, will be apparent to a person of ordinary skill in the art from the foregoing descriptions. Portions and features of some embodiments may be included in, or substituted for, those of others. Many other embodiments will be apparent to those of ordinary skill in the art upon reading and understanding the description provided herein. Such modifications and variations are intended to fall within a scope of the appended claims. The present disclosure is to be limited only by the terms of the appended claims, along with the full scope of equivalents to which such claims are entitled. It is also to be understood that the terminology used herein is for the purpose of describing particular embodiments only and is not intended to be limiting.

In various embodiments, an apparatus is provided that includes a block of memory having sub-blocks that share a common data line. Each of the sub-blocks of the block of memory corresponds to a respective one of a number of segmented sources. Each of the segmented sources of the block of memory is electrically isolated from the other segmented sources of the block of memory.

In at least some of the embodiments of the apparatus, the sub-blocks of the block of memory share a number of common access lines. Each of the common access lines corresponds to a respective one of a number of tiers of memory cells in the block of memory.

In at least some of the embodiments of the apparatus, each of the sub-blocks of the block of memory comprises a respective number of strings of memory cells. Each of the strings of memory cells are coupled to the common data line through a respective drain select device and to the respective segmented source through a respective source select device. The source select devices have a higher breakdown voltage than the drain select devices.

In various embodiments, a three-dimensional device is provided that includes multiple tiers of memory cells. The three-dimensional device includes a first sub-block of a block of memory having a first number of memory cell strings and a first segmented source, and a second sub-block of the block of memory having a second number of memory cell strings and a second segmented source. The first and second segmented sources are electrically isolated.

In at least some of the embodiments of the three-dimensional device, each of the first number of memory cell strings is coupled to a respective one of a first number of drain select devices and each of the second number of memory cell strings is coupled to a respective one of a second number of drain select devices.

In at least some of the embodiments of the three-dimensional device, each of the first number of memory cell strings is coupled to a common data line through a respective one of the first number of drain select devices and each of the second number of memory cell strings is coupled to the common data line through a respective one of the second number of drain select devices.

In various embodiments, an apparatus is provided that includes a block of memory having a first sub-block and a second sub-block. The first sub-block and the second sub-block include a first number of memory cell strings and a second number of memory cell strings, respectively. The block of memory further includes a first segmented source coupled to the first number of memory cell strings in the first sub-block through a first number of source select devices, and a second segmented source coupled to the second number of memory cell strings in the second sub-block through a second number of source select devices. The source select devices having a higher breakdown voltage than the drain select devices.

In various embodiments, an electronic device is provided that includes a block of memory having a number of memory cell strings. Each of the memory cell strings including respective memory cells of a number of memory cells. The memory block being divided into a number of sub-blocks, each of the sub-blocks having non-overlapping ones of the memory cell strings. Each of the sub-blocks further includes a respective one of a number of segmented sources. The respective one of the number of segmented sources being coupled to the memory cell strings of the respective sub-block. The segmented sources of the block are electrically isolated from each other. Respective drain select devices are coupled to the memory cell strings of the respective sub-block. Each of the drain select devices has an asymmetric dopant profile.

In at least some of the embodiments of the apparatus, the asymmetric dopant profile is configured to prevent an erase disturb of non-selected ones of the sub-blocks during an erase operation.

As used herein, the term "or" may be construed in an inclusive or exclusive sense. Additionally, although various exemplary embodiments discussed above focus on a 3D NAND memory device, the embodiments are merely given for clarity in disclosure, and thus, are not limited to NAND memory devices or even to memory devices in general.

The Abstract of the Disclosure is provided to comply with 37 C.F.R. § 1.72(b), requiring an abstract allowing the reader to quickly ascertain the nature of the technical disclosure. The abstract is submitted with the understanding that it will not be used to interpret or limit the claims. In addition, in the foregoing Detailed Description, it may be seen that various features are grouped together in a single embodiment for the purpose of streamlining the disclosure. This method of disclosure is not to be interpreted as limiting the claims. Thus, the following claims are hereby incorporated into the Detailed Description, with each claim standing on its own as a separate embodiment.

What is claimed is:

1. An apparatus, comprising:
a block of memory cells configured in multiple sub-blocks of memory cells, wherein multiple sub-blocks share at least one common data line, wherein each of the sub-blocks includes a respective segmented source, wherein each segmented source is electrically isolated from the other segmented sources of the block of memory cells; and
a memory controller configured to apply a first bias voltage to a segmented source of a sub-block selected to be erased during an erase operation, and to apply a second bias voltage to another segmented source of a sub-block not selected to be erased during the erase operation.

2. The apparatus of claim 1, wherein the first bias voltage is greater than the second bias voltage, and wherein a bias voltage that the memory controller is configured to apply to drain-select lines coupled to drain-select devices of non-selected ones of the sub-blocks is no more than about 75% of the first bias voltage.

3. The apparatus of claim 2, wherein each of the drain-select devices has an asymmetric dopant profile.

4. The apparatus of claim 3, wherein the asymmetric dopant profile in the drain-select devices is configured to prevent a reverse bias condition in a channel of the memory cell in one of the sub-blocks that is not selected for an erase operation.

5. The apparatus of claim 1, wherein each of the multiple sub-blocks includes multiple strings of memory cells that share the at least one common data line, and wherein no sub-block shares a string of memory cells.

6. The apparatus of claim 5, further comprising:
a drain-select device coupled to a respective one of each of the strings of memory cells;
a source-select device coupled to a respective one of each of the strings of memory cells; and
a common source-select line coupled to each of the multiple sub-blocks.

7. The apparatus of claim 6, wherein the source-select device on each of the strings of memory cells has a higher breakdown voltage than the drain-select device on the respective string to prevent an erase disturb of memory cells in adjacent non-selected sub-blocks by preventing a developed erase voltage to be transmitted to adjacent ones of the multiple sub-blocks.

8. The apparatus of claim 5, wherein the strings of memory cells in each of the multiple sub-blocks are independently erasable from the strings of memory cells in remaining ones of the sub-blocks.

9. The apparatus of claim 1, wherein the second bias voltage has a magnitude of between about 0 volts to about 50% that of a magnitude of the first bias voltage.

10. The apparatus of claim 1, wherein access lines and source-select lines are shared in common between the multiple sub-blocks.

11. The apparatus of claim 1, wherein access lines and source-select lines are segmented between the multiple sub-blocks, and wherein the segmented access-lines and the segmented source-select lines within a selected one of the sub-blocks are electrically isolated from the segmented access-lines and the segmented source-select lines within other sub-blocks.

12. A method, comprising:
in an apparatus comprising a block of memory cells having multiple sub-blocks of strings of memory cells, with each of the sub-blocks including a respective segmented source, and wherein each segmented source is electrically isolated from other segmented sources of the block of memory,
determining a sub-block of memory to be erased during an erase operation;
applying a first bias voltage to a respective one of the segmented sources of the sub-block of memory selected to be erased during an erase operation; and
applying a second bias voltage to the number of segmented sources of sub-blocks of the block of memory not selected to be erased during the erase operation, wherein a magnitude of the second bias voltage is lower than a magnitude of the first bias voltage and is selected to avoid an erase-disturb condition in the sub-blocks not selected to be erased during the erase operation.

13. The method of claim 12, wherein the first bias voltage is selected to be sufficient to allow erasure of the sub-block of memory selected to be erased.

14. The method of claim 12, further comprising:
applying a bias voltage to drain-select lines coupled to drain-select devices of non-selected ones of the sub-blocks; and
selecting the bias voltage applied to the drain select-lines to prevent a gate oxide breakdown in the drain-select devices.

15. The method of claim 12, further comprising applying a bias voltage to drain-select lines coupled to drain-select devices of non-selected ones of the sub-blocks.

16. The method of claim 12, wherein the bias voltage applied to the drain-select lines is no more than 75% of the first bias voltage.

17. The method of claim 12, wherein the second bias voltage is between about 0 volts to about 50% of the voltage of the first bias voltage.

18. The method of claim 17, wherein the second bias voltage is selected to be insufficient to effect an erase-disturb condition in the number of sub-blocks of the block of memory not selected to be erased during the erase operation.

19. The method of claim 12, wherein a source-select bias voltage applied to common source-select lines electrically coupled to the multiple sub-blocks is allowed to float.

20. A memory apparatus, comprising:
a block of memory cells configured in multiple sub-blocks of strings of memory cells, wherein each of the multiple sub-blocks has non-overlapping ones of the strings of memory cells, wherein each of the sub-blocks includes a respective segmented source, and wherein each segmented source is electrically isolated from remaining ones of the segmented sources of the block of memory;
multiple respective segmented drain-select lines coupled to multiple strings of memory cells within each of the sub-blocks, the segmented drain-select lines within a sub-block being electrically isolated from other segmented drain-select lines coupled to multiple strings of memory cells within other sub-blocks; and
multiple drain-select devices respectively coupled between a string of memory cells and an associated one of the segmented drain-select lines in each of the sub-blocks, each of the drain-select devices having an asymmetric dopant profile.

21. The memory device of claim 20, wherein the asymmetric dopant profile is configured to prevent an erase disturb of non-selected ones of the strings of memory cells during an erase operation.

22. The memory device of claim 20, wherein access lines and source-select lines are shared in common between the multiple sub-blocks.

23. The memory device of claim 20, wherein access lines and source-select lines are segmented between the multiple sub-blocks, and wherein segmented access-lines and the segmented source-select lines within a selected one of the sub-blocks are electrically isolated from the segmented access-lines and the segmented source-select lines within other sub-blocks.

* * * * *